United States Patent [19]

Braune

[11] 3,819,989

[45] June 25, 1974

[54] PRINTED WIRING BOARD ASSEMBLY

[75] Inventor: David Paul Braune, Westmont, Ill.

[73] Assignee: Bell Telephone Laboratories, Incorporated, Murray Hill, N.J.

[22] Filed: July 16, 1973

[21] Appl. No.: 379,790

[52] U.S. Cl. ......... 317/101 F, 29/624, 317/101 DH, 339/17 F

[51] Int. Cl. ................................................ H05k 1/04

[58] Field of Search ... 317/101 F, 101 DH, 101 LC; 339/17 F, 176 MF; 29/624, 625

[56] References Cited

UNITED STATES PATENTS

| | | | |
|---|---|---|---|
| 2,961,629 | 11/1960 | Kamm | 339/17 F |
| 3,065,383 | 11/1962 | Guillemot | 339/17 F |
| 3,113,248 | 12/1963 | Friedman | 317/101 F |
| 3,755,717 | 8/1973 | Shaw | 317/101 F |

OTHER PUBLICATIONS

Angele, W., "Flat-Conductor Flexible Cables", reprint from Elec. Manuf., Aug. 1960, pp. 78.

*Primary Examiner*—David Smith, Jr.
*Attorney, Agent, or Firm*—William H. Kamstra

[57] ABSTRACT

A printed wiring multiple circuit board assembly fabricated from a single blank, flexible tape carrying a plurality of conductors extending to circuitry carried by the circuit boards. The boards are arranged at right angles to a main tape at the end of tape tabs carrying branching conductors to a board circuitry. The tape tabs are folded and refolded so that the boards come to rest in mutually parallel planes perpendicular to the main tape.

9 Claims, 6 Drawing Figures

30

PRINTED WIRING BOARD ASSEMBLY

BACKGROUND OF THE INVENTION

This invention relates to electrical printed wiring circuit boards and particularly to constructions and methods of fabrication of circuit packs incorporating a plurality of such circuit boards.

Printed wiring circuit boards have long been known in the art and have provided a highly advantageous means for organizing and supporting electrical circuit conductors and components. Such boards, which may be formed of an insulating material such as epoxy, for example, and have the wiring printed thereon by a number of known methods, have made possible in the assembly and operation of electrical circuits a degree of miniaturization, ease of maintenance, reliability, and simplicity of manufacture not priorly available. With respect to each of these exemplary advantages, improvements are constantly being sought however and this is particularly the case in connection with size reduction or, conversely, with circuit board and pack capacity. As the density of the circuit components of individual circuit boards and hence, a circuit pack, increases, the number of incoming and outgoing conductors increases proportionately. The problem is thus presented as to the most efficient and economical manner in which to organize a circuit pack in order to facilitate its assembly and provide orderly access for the conductors.

SUMMARY OF THE INVENTION

One advantageous approach to this problem is offered in the present invention in which the fabrication of a three-dimensional circuit pack construction begins with a single, unitary, flexible tape having all of the conductors required for the pack affixed thereon. The tape terminates on each side with respect to its longitudinal axis in a plurality of secondary tabs extending at right angles therefrom to a plurality of circuit board overlays of the tape, the conductors branching at each tab from the main grouping of conductors to terminals provided on the overlays. The overlays are in a suitable manner individually bonded to the circuit boards. The tape tabs, although generally oppositely arranged from the main tape, alternate in their points of extension and each is aligned off-center with one edge of a circuit board and its tape overlay.

From the foregoing tape blank, the circuit pack construction is assembled by a series of folds formed in the individual tape tabs. A tape tab (together with its overlay and circuit board) is first folded upwardly 90° along a line marking its juncture with the main tape. The tape tab is then folded 180° away from the main tape upon itself along a diagonal line extending from one end of the last-mentioned juncture line to the inner meeting of the tape tab and its overlay. A final 90° fold inwardly to the main tape along a line marking the juncture of the tape tab and its overlay places the latter and its bonded circuit board perpendicular to the main tape and at a right angle to its longitudinal axis. When each of the alternating tape tabs have been thus folded and refolded, a multiboard circuit pack is presented in which the boards lie in mutually parallel planes. The circuit components of each of the boards may be affixed thereto either before or after the folding operations as dictated by convenience of assmbly. A suitable framing arrangement may be provided to maintain the boards rigidly in their parallel relationship and to provide support for conductor terminals.

Advantageously, the capacity of a circuit pack construction according to this invention may be doubled by interleaving the circuit boards of an assembly constructed in the manner described in the foregoing with another similarly constructed so that the main conductor tapes are on opposite sides of the dual construction. As will appear hereinafter, the larger the circuit boards with respect to the height above the conductor tape, the greater spacing is provided for this interleaved dual assembly. A novel and useful circuit pack construction is thus presented in accordance with this invention in which all of the many conductors are prearranged and preconnected to the circuit board terminals before assembly thereby obviating the necessity of making individual connections after the circuit boards are assembled in their final positions in the circuit pack.

BRIEF DESCRIPTION OF THE DRAWING

The organization and method of fabrication of a circuit pack construction according to this invention will be better understood from a consideration of the detailed description of illustrative embodiments thereof which follow when taken in conjunction with the accompanying drawing in which.

DETAILED DESCRIPTION

Figure 1:
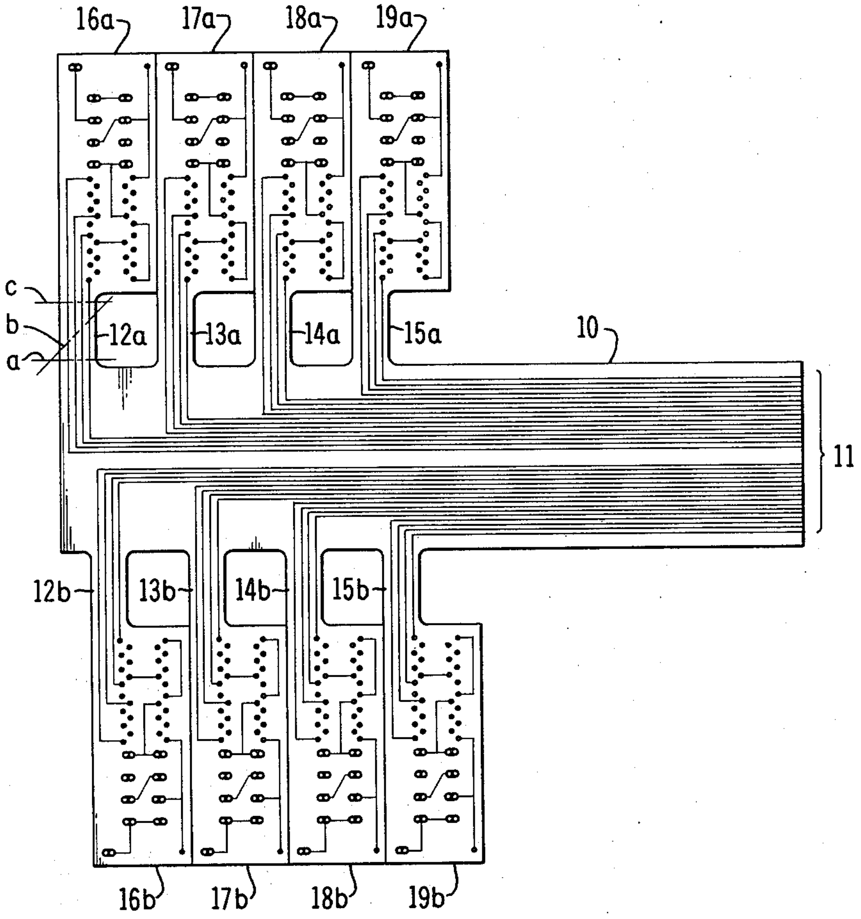
FIG. 1 depicts in plan view a flexible tape blank having affixed thereon a conductor grouping and its branching terminations at a plurality of circuit boards, said tape being depicted before the folding and refolding operations.

A tape blank which is formed to realize a three-dimensional circuit pack assembly according to this invention is shown in plan view in FIG. 1 and comprises a flexible tape 10 of any suitable insulating material capable of having a grouping of electrical conductors 11 imbedded or otherwise affixed therein. The tape 10 is terminated at one end and at each side in a plurality of tabs 12 through 15 extending at right angles from its longitudinal axis. Thus, on one side of the tape 10, tabs 12*a*, 13*a*, 14*a*, and 15*a* extend outwardly therefrom; in a similar manner, tabs 12*b*, 13*b*, 14*b*, and 15*b* extend from the other side. The tabs carry individual groupings of conductors branching from the main grouping 11. The tabs on each side of the tape 10 alternate in their points of extension therefrom for purposes which will become apparent hereinafter; thus, tab 12*a* is shown as extending from the very end of tape 10 while tab 12*b* is inset a small distance. This staggering continues from side to side through the tabs 15*a* and 15*b*. The tabs provide connections between the main tape 10 at each side thereof with two pluralities of tape overlays 16*a*, 17*a*, 18*a*, and 19*a*, and 16*b*, 17*b*, 18*b*, and 19*b*. These overlays are rectangular in form and are adapted in their dimensions to be suitably bonded to conventional rectangular circuit boards. Although these are not shown in the view of FIG. 1, it will be assumed that each of the overlay portions of the tape blank has a circuit board bonded to the underside thereof as viewed in the drawing. The circuit boards conventionally have provided thereon terminal means to which the branching conductor groupings may be preconnected. Additionally, electrical components necessary to complete the circuits carried by the boards may also be premounted.

The tape overlays may conveniently initially be formed on each side of the main tape 10 as connected, unitary tape portions. The overlays may then be severed from each other in any convenient manner to leave the overlays (and their bonded circuit boards) slightly abutting along the longer dimensions. Finally, the tabs 12, etc., which are substantially narrower than the shorter dimensions of the overlays, are each arranged so that one edge is aligned along one edge of an overlay. With the preparation of a tape blank as thus described, the folding operation to realize a three-dimensional construction may now be initiated. This operation will now be described with particular reference to FIGS. 2A, 2B, and 2C where an illustrative tab 12a and its overlay 16*a* of FIG. 1 are shown in progressive stages of the folding operation. It will be understood that the description of the folding of tab 12*a* and its overlay 16*a* applies equally to the remaining tabs and their associated overlays and that the latter are similarly folded.

Figure 2A:
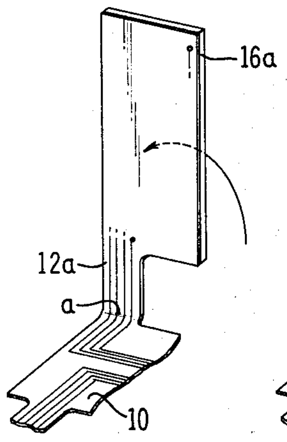
FIGS. 2A, 2B, and 2C demonstrate, respectively, the three specific folding steps required in connection with each circuit board to realize a three-dimensional circuit pack according to this invention.
Figure 2B:
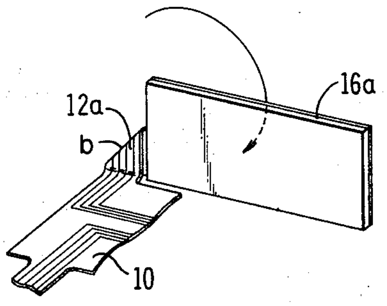
Figure 2C:
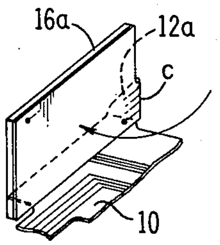
Figure 3:
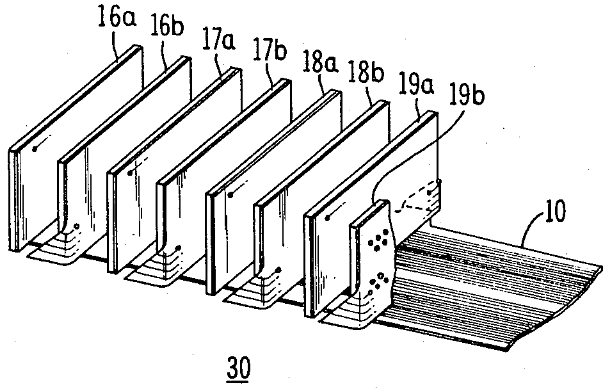
FIG. 3 is a generalized perspective view of an illustrative circuit pack construction resulting from the folding and refolding operations demonstrated with respect to a single circuit board in FIGS. 2A, 2B, and 2C.

The folding operation is accomplished substantially along the lines *a*, *b*, and *c* indicated on the tab 12a in FIG. 1. The first fold of the tab 12*a* is made along the line *a* marking (or at least nearly marking) the juncture of the tab and the main tape portion 10. This fold, as depicted in FIG. 2A, is made 90° upwardly as viewed in the drawing. A second fold is made along the line *b* diagonally across tab 12a from one end of the line *a* to the inner juncture (or nearly so) of the tab 12*a* and its overlay 16a. This fold of the tab is made 180° upon itself and away from the main tape 10 as depicted in FIG. 2B. A final fold as depicted in FIG. 2C is made substantially along the line *c* which closely marks the juncture of the tab 12*a* and its overlay 16*a*. After the folding step of FIG. 2B, it is apparent that the line *c* will be vertical to the plane of the tape 10. The final fold is made 90° inwardly across the main tape 10 with the result that the overlay 16*a* comes to rest at right angles to the tape 10 and in a plane 90° thereto. Each of the remaining tabs is folded in a manner identical to that described in connection with the folding of tab 12*a* to realize a three-dimensional structure as depicted in FIG. 3. Although a particular sequence of folding steps was described, it will be appreciated that other sequences will also result in the final positioning of an overlay as shown in FIG. 2C. Thus, for example, to facilitate the interleaving of the circuit boards, the folding operation may as readily begin with the diagonal fold along the line *b*, the fold along the line *a* then being made last in order to bring the overlays and bonded circuit boards into mutually parallel planes.

Figure 4:
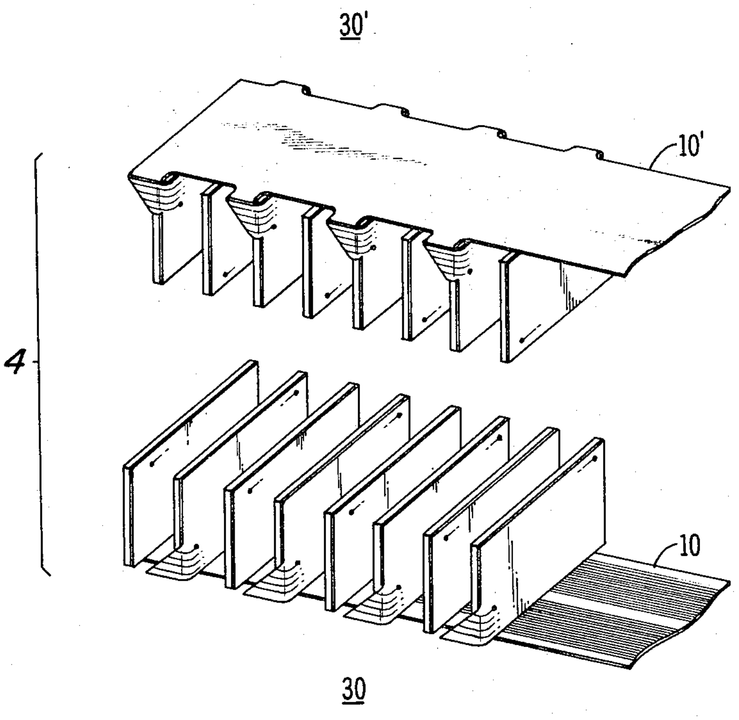
FIG. 4 is a generalized perspective view of an alternative circuit pack arrangement according to this invention in which the circuit boards of two assemblies, one of which is shown in FIG. 3, may be interleaved to realize a doubling of capacity, the assemblies being shown in a spaced-apart relationship for the sake of clarity.

A completely folded assembly 30 is shown in FIG. 3 with overlay 19*b* shown broken away to disclose the alternating side-to-side folding of the tabs. The circuit boards may be maintained in position by any suitable frame means readily envisioned by one skilled in the art. Since such frame means do not constitute an essential part of the invention and are not necessary for an understanding thereof, they are not shown in the drawing. Similarly and for the same reasons, electrical connector arrangements normally terminating the conductor groupings are also omitted. Another advantageous circuit pack arrangement according to the principles of this invention in which the circuit board capacity is doubled is shown in FIG. 4 and comprises two assemblies 30 and 30' each formed in the manner described and as shown in FIG. 3. The assembly 30' is inverted and is positioned so that its circuit boards may be alternately interleaved with the circuit boards of assembly 30 in the interstices presented thereby. For the sake of clarity, the assemblies 30 and 30' are shown in a spaced-apart relationship before being brought together in the interleaved positions. Suitable frame means for maintaining the circuit boards of this arrangement in a fixed relationship are also readily envisioned by one skilled in the art. It is noted that as the capacity of the circuit boards is increased, as by increasing their narrower dimensions, the greater will be the space between the boards for interleaving them to realize the dual arrangement of FIG. 4. Thus, it is apparent from an inspection of the tape blank of FIG. 1 that as the aforementioned dimensions are increased the greater will be the spacing between the tabs 12*a*, etc., and, therefore, between the circuit boards themselves.

What have been described are considered to be only specific illustrative circuit pack arrangements according to this invention and it will be understood that various and numerous other arrangements may be devised by one skilled in the art without departing from the spirit and scope of the invention as defined by the accompanying claims.

What is claimed is:

1. A circuit pack construction comprising a main insulated tape carrying a plurality of electrical conductors, a first plurality of insulated tape tabs integral with and extending at substantially right angles at spaced-apart points from one side of said main tape, each of said tape tabs carrying a group of branching extensions of said plurality of conductors, and a first plurality of insulated tape overlays integral with and extending from said first plurality of tape tabs, respectively, each of said overlays carrying terminations of a group of said branching extensions of said conductors, each of said tape tabs being folded substantially 90° from said main tape along a line defined substantially by its juncture with said main tape, each of said tape tabs also being folded outwardly 180° away from said main tape upon itself along a line extending substantially diagonally from one end of said line defined by said juncture, each of said tape tabs also being folded inwardly 90° toward said main tape along a line defined substantially by its juncture with a tape overlay, whereby said plurality of overlays are arranged in mutually parallel planes perpendicular to said main tape.

2. A circuit pack construction as claimed in claim 1 also comprising a plurality of circuit boards associated, respectively, with said first plurality of overlays, said circuit boards each being adapted to carry electrical circuits thereon connected to said terminations of a group of said branching conductors.

3. A circuit pack construction as claimed in claim 1 also comprising a second plurality of insulated tape tabs integral with and extending at substantially right angles from the other side of said main tape at spaced-apart points in a staggered relationship with said points on said one side of said main tape, each of said tabs of said second plurality of insulated tabs also carrying a group of branching extensions of said plurality of conductors, and a second plurality of insulated tape overlays integral with and extending from said second plurality of tape tabs, respectively, each of said last-mentioned overlays carrying terminations of a group of said branching extensions of said conductors, each of said last-mentioned tape tabs being folded substantially 90° from said main tape along a line defined substantially by its juncture with said main tape, each of said last-mentioned tape tabs also being folded outwardly 180° away from said main tape upon itself along a line extending substantially diagonally from one end of said line defined by said last-mentioned juncture, each of said last-mentioned tape tabs also being folded inwardly 90° toward said main tape along a line defined substantially by its juncture with a tape overlay, whereby said second plurality of overlays are arranged in mutually parallel planes perpendicular to said main tape in alternately interleaved relationship with the overlays of said first plurality of overlays.

4. A circuit pack construction as claimed in claim 3 also comprising a plurality of circuit boards associated, respectively, with said second plurality of overlays, said last-mentioned circuit boards each being adapted to carry electrical circuits thereon connected to said terminations of a group of said branching conductors.

5. A printed wiring board circuit pack construction comprising a main insulated tape carrying a plurality of electrical conductors, a first plurality of rectangular insulated tape overlays lying at right angles from one side of said main tape, said overlays being integrally connected at one corner with said main tape by tape tabs each carrying a group of branching extensions of said plurality of conductors connected to terminations on an associated overlay, and a first plurality of circuit boards associated, respectively, with said first plurality of overlays, said circuit boards being adapted to carry electrical circuits thereon connected to said terminations, each of said tape tabs being folded substantially 90° from said main tape along a line defined substantially by its juncture with said main tape, each of said tape tabs also being folded outwardly 180° away from said main tape upon itself along a line extending substantially diagonally from one end of said line defined by said juncture, each of said tape tabs also being folded outwardly 180° away from said main tape upon itself along a line extending substantially diagonally from one end of said line defined by said juncture, each of said tape tabs also being folded inwardly 90° toward said main tape along a line defined substantially by its juncture with a tape overlay, whereby said plurality of overlays and associated circuit boards are arranged in mutually parallel planes perpendicular to said main tape.

6. A printed wiring board circuit pack construction as claimed in claim 5 also comprising a second plurality of rectangular insulated tape overlays lying at right angles from the other side of said main tape, said last-mentioned overlays also being integrally connected at one corner with said main tape by tape tabs each carrying a group of branching extensions of said plurality of conductors also connected to terminations on an associated overlay, and a second plurality of circuit boards associated, respectively, with said second plurality of overlays, said last-mentioned circuit boards also being adapted to carry electrical circuits thereon connected to said last-mentioned terminations, each of said last-mentioned tape tabs being folded substantially 90° from said main tape along a line defined substantially by its juncture with said main tape, each of said last-mentioned tape tabs also being folded outwardly 180° away from said main tape upon itself along a line extending substantially diagonally from one end of said line defined by said last-mentioned juncture, each of said last-mentioned tape tabs also being folded inwardly 90° toward said main tape along a line defined substantially by its juncture with a tape overlay, whereby said second plurality of overlays and associated circuit boards are arranged in mutually parallel planes perpendicular to said main tape in alternately interleaved relationship with the overlays and associated circuit boards of said first plurality of overlays and circuit boards.

7. In combination, a first and a second printed wiring board circuit pack construction each as claimed in claim 6, said first construction being inverted with respect to said second construction and positioned relative to said second construction so that its overlays and associated circuit boards are alternately interleaved with the overlays and associated circuit boards of said second construction.

8. The method of fabricating a printed wiring board circuit pack construction comprising the steps of folding each of a first plurality of tabs connecting, respectively, a first plurality of circuit boards at right angles with one side of a main conductor tape 90° from said main tape along a line defined substantially by its juncture with said main tape, folding each of said tabs outwardly 180° away from said main tape upon itself along a line extending substantially diagonally from one end of said line defined by said juncture, and folding each of said tabs inwardly 90° toward said main tape along a line defined substantially by its juncture with a circuit board, with the result that said first plurality of circuit boards are arranged in mutually parallel planes perpendicular to said main tape.

9. The method of fabricating a printed wiring board circuit pack construction as claimed in claim 8 also comprising the steps of folding each of a second plurality of tabs connecting, respectively, a second plurality of circuit boards at right angles with the other side of said main conductor tape 90° from said main tape along a line defined substantially by its juncture with said main tape, folding each of said second plurality of tabs outwardly 180° away from said main tape upon itself along a line extending substantially diagonally from one end of said line defined by said last-mentioned juncture, and folding each of said last-mentioned tabs inwardly 90° toward said main tape along a line defined substantially by its juncture with a circuit board, with the result that said second plurality of circuit boards are arranged in mutually parallel planes perpendicular to said main tape in alternately interleaved relationship with the overlays of said first plurality of circuit boards.

* * * * *